United States Patent
Hashimoto

(10) Patent No.: US 7,602,012 B2
(45) Date of Patent: Oct. 13, 2009

(54) SEMICONDUCTOR MEMORY DEVICES WITH CHARGE TRAPS

(75) Inventor: Keiichi Hashimoto, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 169 days.

(21) Appl. No.: 11/896,685

(22) Filed: Sep. 5, 2007

(65) Prior Publication Data
US 2008/0251835 A1    Oct. 16, 2008

(30) Foreign Application Priority Data
Sep. 21, 2006   (JP) ............................ 2006-255653

(51) Int. Cl.
*H01L 29/792* (2006.01)
(52) U.S. Cl. .................. 257/324; 257/E29.309; 257/E21.423; 257/640; 438/216
(58) Field of Classification Search .............. 257/324, 257/E29.309
See application file for complete search history.

(56) References Cited
U.S. PATENT DOCUMENTS

| | | | | |
|---|---|---|---|---|
| 6,774,462 B2* | 8/2004 | Tanaka et al. | ............... | 257/639 |
| 2004/0155280 A1* | 8/2004 | Kim et al. | ................... | 257/314 |
| 2004/0233713 A1* | 11/2004 | Iwase et al. | ............... | 365/185.2 |
| 2005/0002240 A1* | 1/2005 | Hamaguchi et al. | .... | 365/185.33 |
| 2005/0041472 A1* | 2/2005 | Matsuoka et al. | ....... | 365/185.16 |
| 2005/0199945 A1* | 9/2005 | Kodama et al. | ............. | 257/324 |
| 2006/0187709 A1* | 8/2006 | Ogura et al. | ........... | 365/185.03 |
| 2006/0194388 A1* | 8/2006 | Hashimoto | .................. | 438/257 |

FOREIGN PATENT DOCUMENTS

| | | |
|---|---|---|
| JP | H09-064205 | 3/1997 |
| JP | 2002-184873 | 6/2002 |
| JP | 2003-347543 | 12/2003 |
| JP | 2005-064295 | 3/2005 |
| JP | 2006-237423 | 9/2006 |

* cited by examiner

Primary Examiner—David Vu
Assistant Examiner—Earl N Taylor
(74) Attorney, Agent, or Firm—Rabin & Berdo, PC

(57) ABSTRACT

A memory cell in a semiconductor memory device has a pair of charge traps formed on opposite sides of a control electrode, above variable resistance regions in the semiconductor substrate. Each charge trap includes a tunnel oxide film, a dual-layer charge trapping film, and a top oxide film. The dual-layer charge trapping film includes a silicon-rich silicon nitride layer or amorphous silicon layer adjacent to the tunnel oxide film, and a stoichiometric or nitrogen-rich silicon nitride layer adjacent to the top oxide film. Most charges injected into the charge trapping film are trapped in the layer adjacent to the tunnel oxide film, near the substrate, which facilitates the reading of the data that the trapped charges represent.

13 Claims, 7 Drawing Sheets

SEMICONDUCTOR MEMORY DEVICES WITH CHARGE TRAPS

BACKGROUND OF THE INVENTION

1. Field of the Invention

The present invention relates to a semiconductor memory device, more particularly to the structure of charge traps in a semiconductor nonvolatile memory device.

2. Description of the Related Art

Semiconductor nonvolatile memory devices having charge traps with a silicon/oxide/nitride/oxide/silicon (SONOS) structure are known (see, for example, JP 9-64205, JP 2002-184873, and JP 2003-347543; 'JP' denotes a Japanese patent application publication). A conventional semiconductor nonvolatile memory cell of the SONOS type (a SONOS memory cell) will be described with reference to FIG. 1, which shows a schematic sectional view of the memory cell, and FIG. 2, which is an energy level diagram.

Referring to FIG. 1, the SONOS memory cell is formed on the surface of a silicon substrate 120, in an active area 122 isolated from other active areas by an isolation region (not shown) such as a silicon oxide film formed by local oxidation of silicon (LOCOS) or shallow trench isolation (STI). The SONOS memory cell includes a tunnel oxide film 141, a charge trapping film 142, and a blocking oxide film 147, formed in this sequence one atop another.

In one exemplary device, the tunnel oxide film 141 is formed by thermal oxidation of the surface of the silicon substrate 120 and is seven nanometers (7 nm) thick. The charge trapping film 142 and blocking oxide film 147 are formed by low-pressure chemical vapor deposition (LP-CVD) and are 6 nm and 9 nm thick, respectively. For the charge trapping film 142, the deposition temperature is 755° C., the reaction gases are ammonia ($NH_3$) and dichlorosilane (DCS: $SiH_2Cl_2$) with respective flow rates of 1000 sccm and 100 sccm, and the deposition pressure is 33.3 Pascals (33.3 Pa, equivalent to 0.25 Torr), where the unit sccm (standard cubic centimeters per minute) represents the gas flow rate converted to a temperature of 0° C. and a pressure of 1 atmosphere (1013 hPa). Under these conditions, the charge trapping film 142 becomes stoichiometric. Specifically, the charge trapping film 142 has the formula $Si_xN_y$, where x and y have values of substantially 3 and 4, respectively, resulting in an x/y ratio of substantially 0.75.

The SONOS memory cell also includes a control electrode, more specifically a gate electrode 134 having a polycide structure including a polysilicon film 135 and a tungsten silicide film 136, each approximately 100 nm thick, stacked atop the blocking oxide film 147. The polysilicon film 135 is formed by, for example, chemical vapor deposition (CVD) and is doped with phosphorous (P) at a concentration of about $3 \times 10^{20}$ carriers/$cm^3$. The tungsten silicide film 136 is sputtered onto the polysilicon film 135.

Diffusion regions 124a, 124b are also formed in the surface of the silicon substrate 120 on mutually opposite sides of the gate electrode 134 to function as source and drain regions. The diffusion regions 124a, 124b are doped with arsenic (As) at a dose of at least $1 \times 10^{15}$ carriers/$cm^2$, after which activation annealing is carried out at a temperature of about 1000° C.

The silicon substrate 120 and gate electrode 134 are protected by an interlayer dielectric film 150 of borophosphosilicate glass (BPSG), which is formed with a thickness of about 1000 nm and then planarized by chemical mechanical polishing (CMP). The interlayer dielectric film 150 includes tungsten plugs 155 that electrically connect the diffusion regions 124a, 124b and the gate electrode 134 to aluminum interconnecting lines 160 formed on the interlayer dielectric film 150.

A SONOS memory cell having the above structure stores information in the form of charge, for example, electrons, trapped in the charge trapping film 142. The charge trapping film 142 can trap electrons locally, so the charge can be stored independently on the source and drain sides of the charge trapping film 142 by generating hot carriers in either the source or drain side of the channel formed below the gate electrode 134 in the silicon substrate 120. That is, a SONOS memory can store two bits information per memory cell.

The trapping mechanism is illustrated by the energy level diagram in FIG. 2, which shows the 1.1-electron volt (1.1-eV) band gap of the silicon substrate 120, the 9-eV band gap of the tunnel oxide film 141, the 5-eV band gap of the stoichiometric charge trapping film 142, the charge trapping level 'a' in the forbidden band of the charge trapping film 142, the band gaps of the blocking oxide film 147 and polysilicon film 135, and the Fermi energy level Ef. The band gap is the gap between the conduction-band and the valence band. The upper boundary of the band gap is the minimum energy level of the conduction band. The upper boundary of the band gap of the charge trapping film 142 is about 1 eV below the upper boundaries of the band gaps of the tunnel oxide film 141 and blocking oxide film 147. An electron injected into the charge trapping film 142 by tunneling is accordingly confined to the charge trapping film 142 by potential energy barriers with a height of approximately 1 eV, and is likely to become trapped at level 'a' before it can escape.

Since the charge trapping level in the charge trapping film 142 is only about 1 eV below the upper boundary level of the band gap, however, and since the activation energy needed to inject an electron into the charge trapping film 142 is also about 1 eV, the electron trapping efficiency is not high. The charge retention characteristics of the charge trapping film 142 are also less than adequate.

A charge trapping film structure with improved charge retention characteristics and a method of manufacturing the structure are disclosed in JP 2002-184873 and JP 2003-347543. This structure will be described with reference to the schematic sectional view in FIG. 3 and the energy level diagram in FIG. 4, omitting descriptions of elements that appeared in FIG. 1.

The charge trapping film 143 in FIG. 3 has a dual-layer structure including a stoichiometric first silicon nitride film 144 and a silicon-rich second silicon nitride film 145. JP 9-64205 describes a method of forming such a charge trapping film: a stoichiometric silicon nitride film is deposited and then silicon ions are implanted into the surface of the silicon nitride film.

As shown in FIG. 4, the silicon-rich second silicon nitride film 145 has a narrower band gap than the stoichiometric first silicon nitride film 144, and a deeper charge trapping level (depth >1 eV) than the stoichiometric charge trapping film 142 in FIG. 1. Electrons injected into the charge trapping film 143 easily reach the second silicon nitride film 145, but once trapped at level 'a', they are confined by a high potential energy barrier between the second silicon nitride film 145 and the blocking oxide film 147, while the increased distance of the charge trapping site ('a') from the silicon substrate 120 reduces charge leakage into the silicon substrate 120 through the tunnel oxide film 141. Charge retention characteristics are accordingly improved.

Charge-trap semiconductor memory devices are not limited to the SONOS memory described above; there is also a sidewall type of semiconductor nonvolatile memory (referred to below simply as a sidewall memory) disclosed in, for example, JP 2005-64295. An exemplary conventional sidewall memory will be described with reference the schematic sectional view in FIG. 5.

A unit cell 210 (referred to below as a memory cell) in a sidewall memory includes a metal-oxide-semiconductor field-effect transistor (MOSFET) formed on a silicon substrate 220. The MOSFET includes a gate electrode 234, first and second diffusion regions 224a, 224b, and first and second variable resistance regions 222a, 222b. A gate electrode 234 is formed on a gate oxide film 232 disposed on the silicon substrate 220. The gate electrode 234 may have a polycide structure including a polysilicon film 235 underlying a tungsten silicide film 236, as shown.

The first and second diffusion regions 224a, 224b are formed by diffusing, for example, an n-type impurity into the regions located on mutually opposite sides of the gate electrode 234. These regions function interchangeably as the source and drain of the MOSFET.

The first and second variable resistance regions 222a, 222b are disposed between the first and second diffusion regions 224a, 224b and the gate electrode 234, and have the same conductivity type as the first and second diffusion regions 224a, 224b. In this example, an n-type impurity is diffused into the first and second variable resistance regions 222a, 222b, but at a lower concentration than in the first and second diffusion regions 224a, 224b.

This semiconductor nonvolatile memory has a first charge trap 240a on the first variable resistance region 222a and a second charge trap 240b on the second variable resistance region 222b. The first and second charge traps 240a, 240b both have a multi-layer charge-trapping structure comprising a tunnel oxide film 241, a silicon nitride charge trapping film 243 overlying the tunnel oxide film 241, and a top oxide film 247 overlying the charge trapping film 243, forming an oxide-nitride-oxide (ONO) dielectric stack.

To inject electrons into the first charge trap 240a, for example, a positive voltage is applied to the gate electrode 234 and the first diffusion region 224a, which functions as the drain, and the second diffusion region 224b (functioning as the source) and substrate 220 are connected to ground. Under these conditions, electrons flow through a channel that forms below the gate electrode 234 between the source and drain. As they pass through the first variable resistance region 222a, the electrons are brought into high energy states by the strong electric field emanating from the drain and become so-called hot carriers. These hot electrons are pulled into the first charge trap 240a by the electric field emanating from the gate electrode 234, and become trapped in the charge trapping film 243.

The state with injected electrons trapped in the charge trapping film 243 is defined as representing the data '1' and is referred to as the programmed state, whereas the state without trapped electrons is defined as representing the data '0' and is referred to as the erased state.

When electrons are trapped in the first charge trap 240a, for example, the electric field from the trapped electrons expels electrons from the surface of the first variable resistance region 222a, reducing the number of carriers (electrons) available to conduct current and thus increasing the electrical resistance of the first variable resistance region 222a. If the adjacent first diffusion region 224a is connected to ground and the second diffusion region 224b and the gate electrode 234 are biased at a positive potential, thereby reversing the source and drain roles, an electron current flows to the drain (which is now the second diffusion region 224b), but at a reduced rate because of the increased resistance of the first variable resistance region 222a. If no electrons are trapped in the first charge trap 240a, the resistance value of the first variable resistance region 222a is not increased, and the normal drain current is obtained. The stored data value ('1' or '0') is read by sensing the drain current.

The charge trapping film described in JP 2002-184873 and JP 2003-347543, having a multi-layer structure including a stoichiometric silicon nitride film and a silicon-rich silicon nitride film formed in sequence on the tunnel oxide film, is regarded as an adequately effective SONOS semiconductor memory structure. Direct application of this charge trapping film to the conventional sidewall memory shown in FIG. 5, however, is thought to be inappropriate. The reason for this will be described with reference to FIGS. 5 to 8.

FIGS. 6 to 8 illustrate the charge trapping location dependency of the drain current of the sidewall nonvolatile memory cell in FIG. 5 when the first charge trap 240a is programmed and the second charge trap 240b is erased. FIGS. 6 and 7 are enlarged sectional views of parts of the first charge trap 240a and first variable resistance region 222a. In FIG. 6, charge is trapped at a location X near the interface 241a between the tunnel oxide film 241 and the charge trapping film 243; in FIG. 7, charge is trapped at a location Y at some distance from this interface 241a.

FIG. 8 is a graph obtained by simulating the drain currents when the programmed and erased data are read. The horizontal axis represents gate voltage $V_{gate}$ in volts and the vertical axis represents drain current $I_{drain}$ in amperes. Drain currents are shown as positive when the first diffusion region 224a is grounded and the second diffusion region 224b is biased at a positive voltage, and negative when the second diffusion region 224b is grounded and the first diffusion region 224a is biased at a positive voltage.

In the example in FIG. 8, since the first charge trap 240a has been programmed by injecting electrons and the second charge trap 240b is in the erased state, the drain currents $I_X$, $I_Y$ for reading the programmed data are obtained when the first diffusion region 224a is grounded and the second diffusion region 224b biased at a positive potential. The magnitude of these currents indicates whether charge is trapped in the first charge trap 240a or not.

The drain currents $II_X$, $II_Y$ for reading the erased data are obtained by reversing the biasing of the first and second diffusion regions 224a, 224b so that the second diffusion region 224b is at the ground potential and the first diffusion region 224a is at a positive potential. The magnitude of these currents indicates whether charge is trapped in the second charge trap 240b or not.

Curves $I_X$ and $II_X$ in FIG. 8 represent the currents flowing when charge is trapped near the interface 241a in the first charge trap 240a as shown in FIG. 6. Curves $I_Y$ and $II_Y$ represent the currents flowing when charge is trapped in the first charge trap 240a at a position distant from the interface 241a as shown in FIG. 7.

These currents were simulated under the assumptions that the thickness of the tunnel oxide film 241 is 65 nm and the distance from the interface 241a to location Y in FIG. 7 is 40 nm.

When charge is trapped at location X near the interface 241a between the tunnel oxide film 241 and the charge trapping film 243, the drain current curve $I_X$ for the programmed state differs greatly from the drain current curve $II_X$ for the erased state. The programmed and erased states can accordingly be easily distinguished.

In contrast, when charge is trapped at location Y, distant from the interface 241a between the tunnel oxide film 241 and the charge trapping film 243, the drain current curve $I_Y$ for the programmed state is almost identical to the drain current curve $II_y$ for the erased state, although their signs are opposite in FIG. 8. The programmed and erased states are therefore difficult to distinguish; the memory cell cannot be expected to function properly.

A charge trapping film with the structure disclosed in JP 2002-184873 and JP 2003-347543 (FIG. 3) traps electrons at positions comparatively distant from the silicon substrate, and thus distant from the interface between the charge trapping film and the tunnel oxide film. Therefore, this structure is not appropriate for a charge trapping film used in a sidewall memory.

SUMMARY OF THE INVENTION

An object of the present invention is to provide a semiconductor memory device in which charge can be trapped near the interface between the charge trapping film and the tunnel oxide film.

Another object of the invention is to provide a semiconductor memory device in which the potential energy barrier between the tunnel oxide film and the charge trapping film is raised to prevent the escape of trapped charge into the substrate.

Yet another object of the invention is to provide a method of manufacturing a semiconductor memory device of the above type.

A memory cell in a semiconductor memory device according to the present invention comprises a control electrode, a pair of diffusion regions, a pair of variable resistance regions, and a pair of charge traps. The control electrode is formed on a gate insulating film disposed on a major surface of a semiconductor substrate. The pair of diffusion regions are formed in this major surface of the semiconductor substrate on mutually opposite sides of the control electrode. The pair of variable resistance regions are formed in the same major surface of the semiconductor substrate on mutually opposite sides of the control electrode, disposed between the pair of diffusion regions and the control electrode, and have a lower impurity concentration than the pair of diffusion regions. The pair of charge traps are disposed above the pair of variable resistance regions. Each charge trap includes a tunnel oxide film, a charge trapping film, and a top oxide film.

The charge trapping film has a dual-layer structure including a first layer formed on the tunnel oxide film and a second layer formed on the first layer. The upper boundary of the band gap of the first layer is lower than the upper boundary of the band gap of the second layer. The first layer has a charge trapping level located within its band gap.

Electrons injected into the charge trapping film through the tunnel oxide film encounter a potential energy barrier between the first and second layers, so that they tend to become trapped at the charge trapping level in the first layer. As the trapping sites are comparatively near the tunnel oxide film, the trapped charge has a large effect on current flow through the memory cell, enabling stored data to be read easily.

In one aspect of the invention, the first layer is a silicon-rich silicon nitride layer and the second layer is a stoichiometric or nitrogen-rich silicon nitride layer.

In another aspect of the invention, the first layer is an amorphous silicon layer and the second layer is a stoichiometric, or nitrogen-rich silicon nitride layer.

With either of these structures, the potential energy barrier between the first layer and the tunnel oxide film is higher than the potential energy barrier between a stoichiometric silicon nitride film and a tunnel oxide film, so the electrons trapped in the first silicon nitride film cannot easily escape into the semiconductor substrate through the tunnel oxide film. Charge retention is thereby improved, as compared with the trapping of charge in a stoichiometric silicon nitride layer.

DETAILED DESCRIPTION OF THE INVENTION

Figure 1:
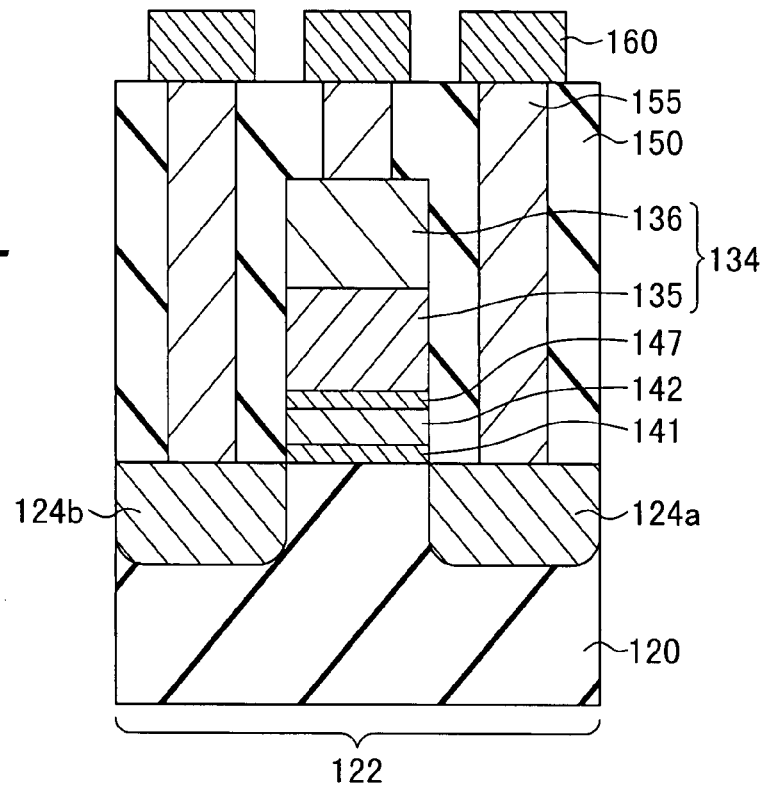
FIG. 1 is a schematic sectional view illustrating a conventional SONOS memory cell;.

Embodiments of the invention will now be described with reference to the attached drawings, in which like elements are indicated by like reference characters. The embodiments describe specific exemplary compositions (materials) and give exemplary numeric values, but these are not intended to limit the scope of the invention.

FIRST EMBODIMENT

Figure 9:
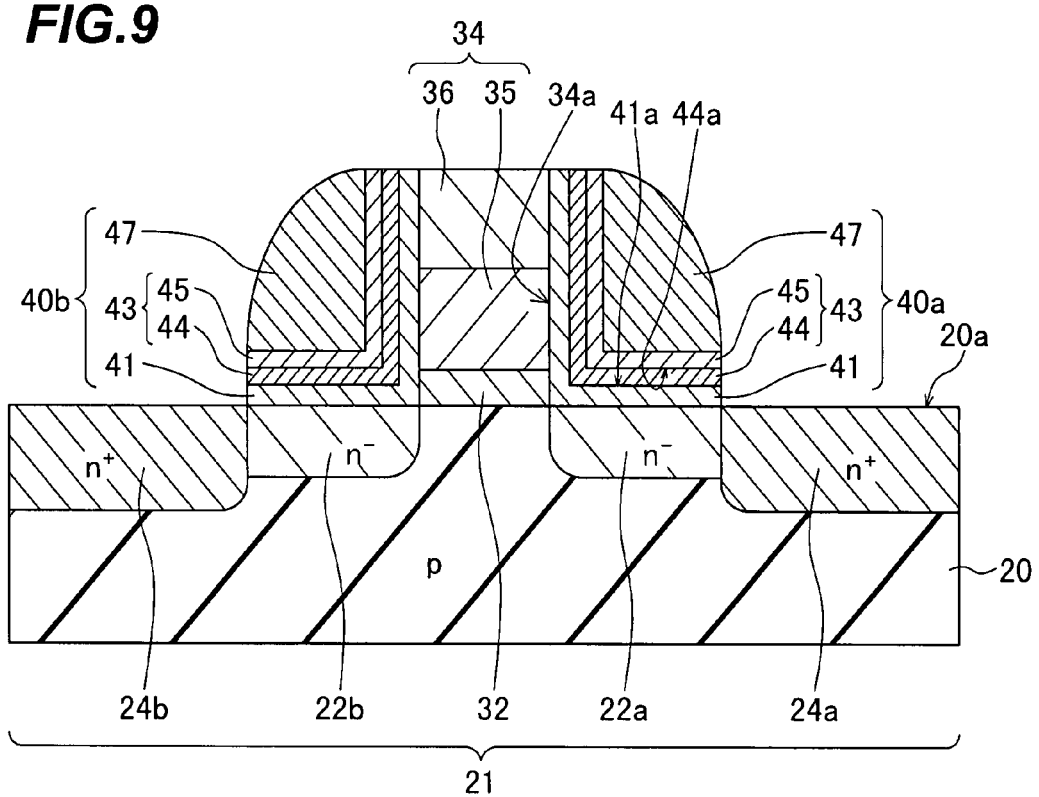
FIG. 9 is a schematic sectional view illustrating a semiconductor memory cell according to a first embodiment of the invention.

The first embodiment is a sidewall memory-comprising memory cells with the cross-sectional structure shown in FIG. 9. Each memory cell is an n-channel MOSFET formed in a p-type semiconductor silicon substrate 20, in an active area 21 isolated from other active areas by an isolation region (not shown). The isolation region is a silicon oxide film formed by local oxidation of silicon (LOCOS) or shallow trench isolation (STI). P-type impurity ions may be implanted into the silicon substrate 20 at a desired concentration to adjust the MOSFET threshold voltage.

The MOSFET comprises a control electrode or gate electrode 34, first and second diffusion regions 24a, 24b, and first and second variable resistance regions 22a, 22b.

The gate electrode 34 is formed on a gate oxide film 32, which is disposed on one major surface 20a of the silicon substrate 20. The gate oxide film 32 may be, for example, a silicon oxide film. The gate electrode 34 has a polycide structure including a polysilicon film 35 underlying a tungsten silicide film 36.

The first and second diffusion regions 24a, 24b are formed in this major surface 20a of the silicon substrate 20 on mutually opposite sides of the gate electrode 34 by diffusing, for example, an n-type impurity at a high concentration to form n+ layers that function interchangeably as the source and drain of the MOSFET.

The first and second variable resistance regions 22a, 22b are disposed in the same major surface 20a of the silicon substrate 20 between the first and second diffusion regions 24a, 24b and the gate electrode 34 and have the same conductivity type as the first and second diffusion regions 24a, 24b. In this example, an n-type impurity is diffused into the first and second variable resistance regions 22a, 22b.

The first and second variable resistance regions 22a, 22b have a lower impurity concentration than the first and second diffusion regions 24a, 24b, as indicated by the notation 'n⁻'. This structure has the effect of concentrating electric fields at the peripheries of the first and second variable resistance regions 22a, 22b to selectively inject charge, e.g., electrons, into first and second charge traps 40a, 40b which will be described later. Because of this electric field concentration, the occurrence of hot carriers is concentrated in the first and second variable resistance regions 22a, 22b. The impurity concentration and size (width and depth) of the first and second variable resistance regions 22a, 22b are design choices that can be altered to suit various purposes. The first and second variable resistance regions 22a, 22b have substantially the same structure as a lightly doped drain (LDD).

A first charge trap 40a is formed on the first variable resistance region 22a and a second charge trap 40b formed on the second variable resistance region 22b. These charge traps 40a, 40b are formed as sidewalls of the gate electrode 34.

The two charge traps 40a, 40b have a multi-layer structure, each comprising a tunnel oxide film 41, a charge trapping film 43, and a top oxide film 47, formed in this sequence to create an ONO dielectric stack.

The tunnel oxide film 41 is a silicon oxide film with a thickness of, for example, 10 nm formed on the side surfaces 34a of the gate electrode 34 and the top surfaces of the first and second variable resistance regions 22a, 22b.

The charge trapping film 43 has a thickness of, for example, 10 nm, and is formed on the tunnel oxide film 41 to trap electrons.

The top oxide film 47 is a silicon oxide film with a thickness of, for example, 40 nm formed on the charge trapping film 43.

The thicknesses of the tunnel oxide film 41, charge trapping film 43, and top oxide film 47 are measured with respect to the side surfaces 34a of the gate electrode 34.

The charge trapping film 43 has a dual-layer structure including a first silicon nitride layer 44 formed adjacent to the tunnel oxide film 41 and a second silicon nitride layer 45 formed adjacent to the top oxide film 47, the first silicon nitride layer 44 being silicon-rich, the second silicon nitride layer 45 being stoichiometric or nitrogen-rich.

Figure 2:
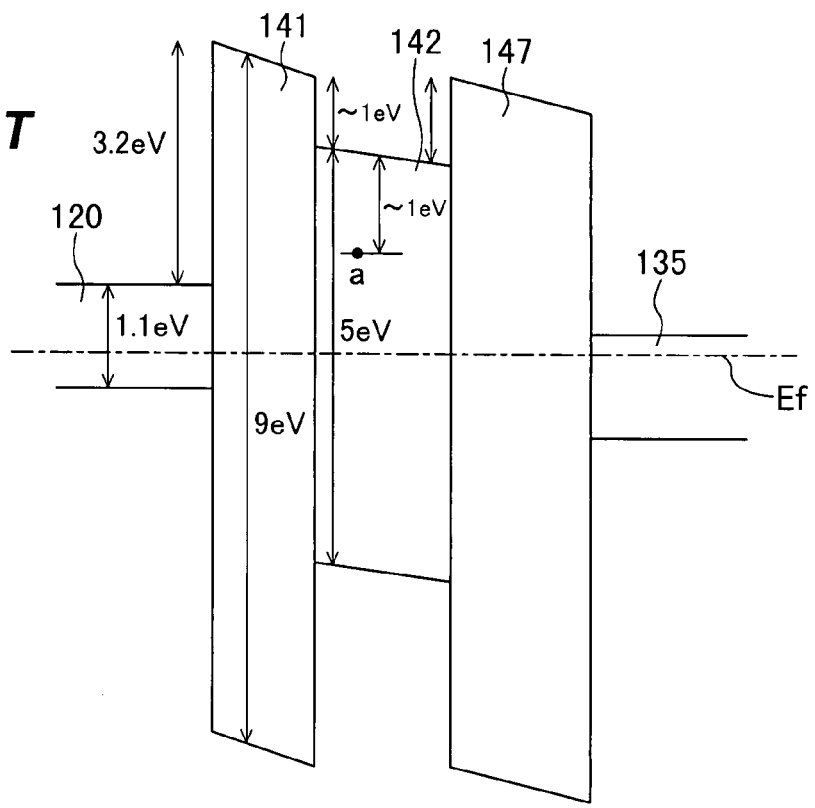
FIG. 2 is an energy level diagram of the memory cell in FIG. 1.
Figure 3:
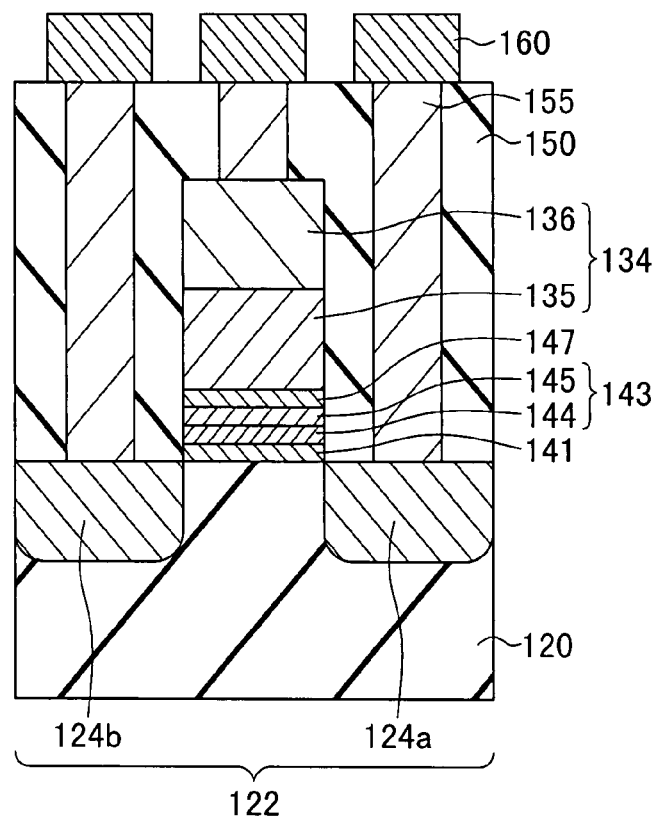
FIG. 3 is a schematic sectional view illustrating another conventional SONOS memory cell.
Figure 4:
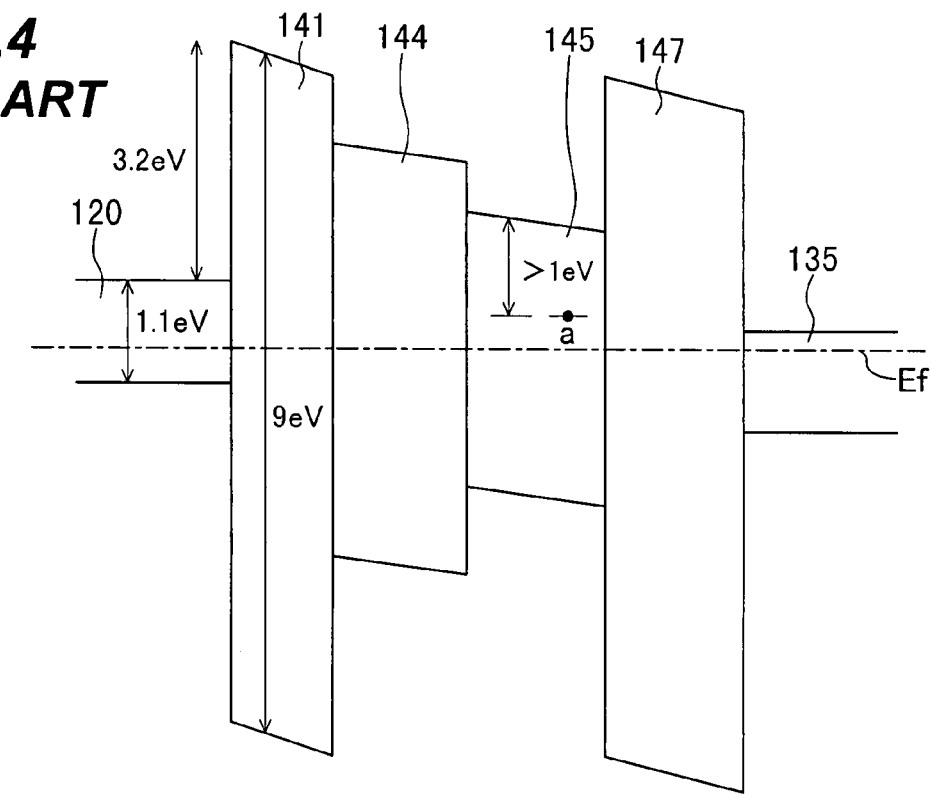
FIG. 4 is an energy level diagram of the memory cell in FIG. 3.
Figure 10:
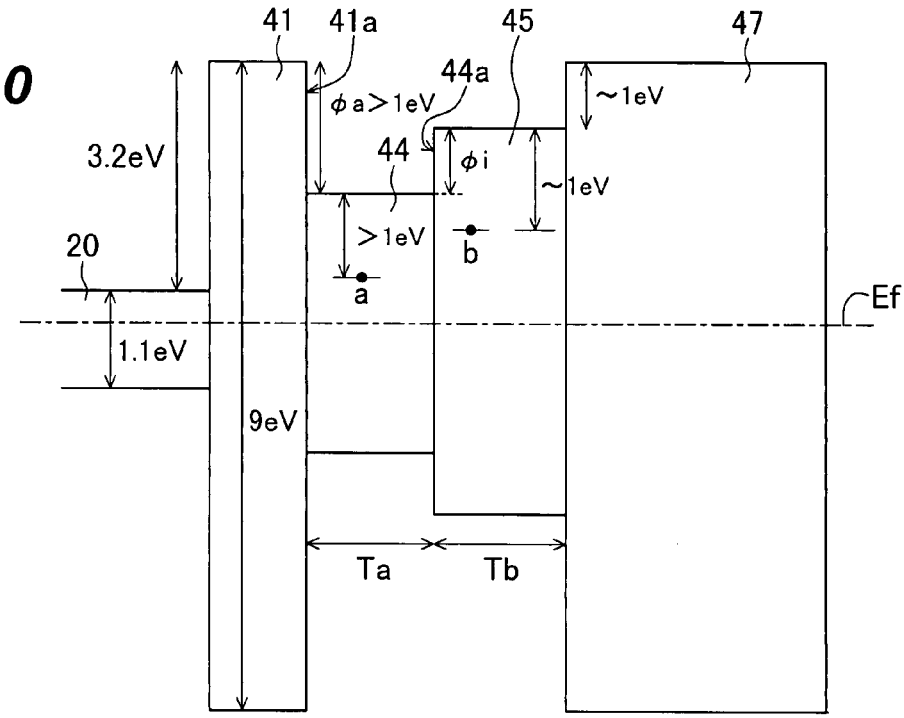
FIG. 10 is an energy level diagram of the memory cell in FIG. 9.

The silicon-rich first silicon nitride layer 44 has the formula $Si_xN_y$, where the ratio x/y is greater than 0.75. Referring to FIG. 10, the formation of the silicon-rich first silicon nitride layer 44 on the tunnel oxide film 41 raises the potential energy barrier φa at the interface 41a between the tunnel oxide film 41 and the charge trapping film 43. Depending on the ratio x/y, the height of this barrier φa can be expected to approach the height of the barrier between the tunnel oxide film 41 and the silicon substrate 20 (approximately 3.2 eV). As a result, a potential energy barrier higher than the conventional value of 1 eV is obtained. The electron trapping level ('a') is also deeper in this silicon-rich silicon nitride layer 44 than in the stoichiometric silicon nitride film in FIG. 2. Electron trapping efficiency and charge retention are improved accordingly.

To ensure a potential energy barrier higher than 1 eV, the atomic ratio (x/y) of the silicon-rich first silicon nitride layer 44 is preferably at least 0.8.

The second silicon nitride layer 45 is a stoichiometric silicon nitride film, that is, an $Si_xN_y$ in which the ratio x/y is substantially 0.75, or a nitrogen-rich silicon nitride film, that is, an $Si_xN_y$ film in which the ratio x/y is less than 0.75. The formation of the stoichiometric or nitrogen-rich second silicon nitride layer 45 on the silicon-rich first silicon nitride layer 44 creates a potential energy barrier φi at the interface 44a between the first silicon nitride layer 44 and the second silicon nitride layer 45. The second silicon nitride film 45 also has a charge trapping level 'b', located at a depth of about 1 eV from the upper boundary of the band gap.

Even if a hot electron injected through the tunnel oxide film 41 into the first silicon nitride layer 44 is not trapped at level 'a' in the first silicon nitride layer 44 and jumps directly to the conduction band of the first silicon nitride layer 44, the electron cannot as easily jump to the conduction band of the second silicon nitride layer 45 because of the potential energy barrier φi between the first and second silicon nitride layers 44, 45. As a result, most injected hot electrons remain confined in the first silicon nitride layer 44 and eventually become trapped. Moreover, a hot electron that does succeed in reaching the second silicon nitride layer 45 will generally become trapped at level 'b' in the second silicon nitride layer 45 at a site located near the interface 44a between the first and second silicon nitride layers 44, 45.

The higher the potential energy barrier φi at the interface 44a between the first and second silicon nitride layers 44, 45 is, the more effectively electrons are trapped in the first silicon nitride layer 44. Accordingly, the silicon-to-nitrogen atomic ratio (x/y) of the second silicon nitride layer 45 is preferably at most 0.7.

The invention is not limited to the use of silicon nitride layers as described above. For example, a nitrogen-doped amorphous silicon layer containing several percent of nitrogen atoms may be used as the first layer 44. Various other types of amorphous silicon layers may also be used. More generally, the two layers 44, 45 may have any atomic composition, including any atoms or compounds composed of any atoms, provided that they have electron trapping levels and that when they are stacked, their band gaps have different upper boundaries, the higher upper boundary belongs to the layer 45 more distant from the silicon substrate, and both upper boundaries are lower than the upper boundaries of the band gaps of the surrounding oxide layers 41, 47.

The two layers 44, 45 need not be formed as successively deposited films. The invention may also be practiced by depositing a single film and then forming two layers with different characteristics by implanting impurity ions into one of the layers.

In any case, the layer 44 on the side near the silicon substrate preferably has a deeper electron trapping level, a higher trap density, and a smaller thickness than the film or layer 45 on the side farther from the silicon substrate.

Figure 6:
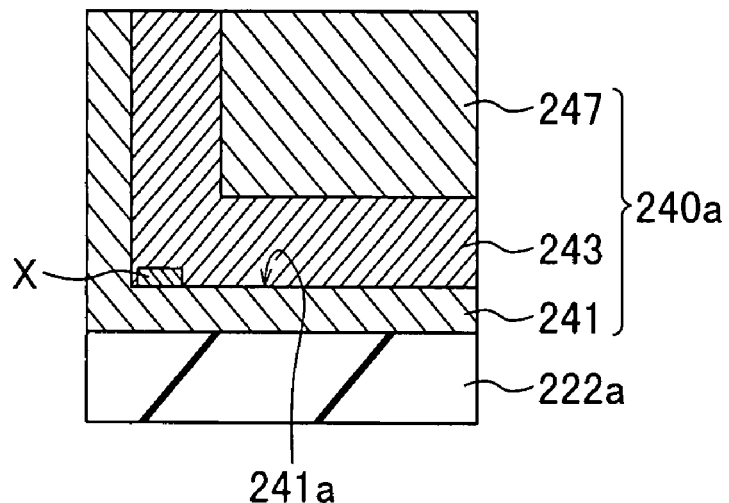
FIGS. 6 and 7 are enlarged sectional views of part of the conventional sidewall memory cell in FIG. 5.
Figure 7:
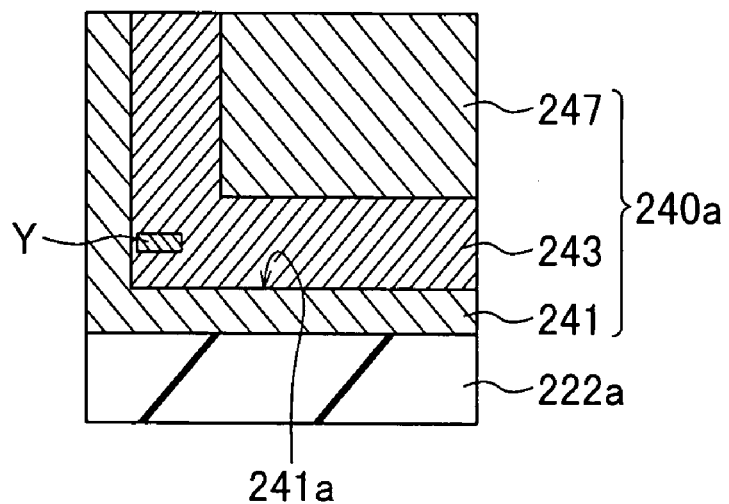
Figure 8:
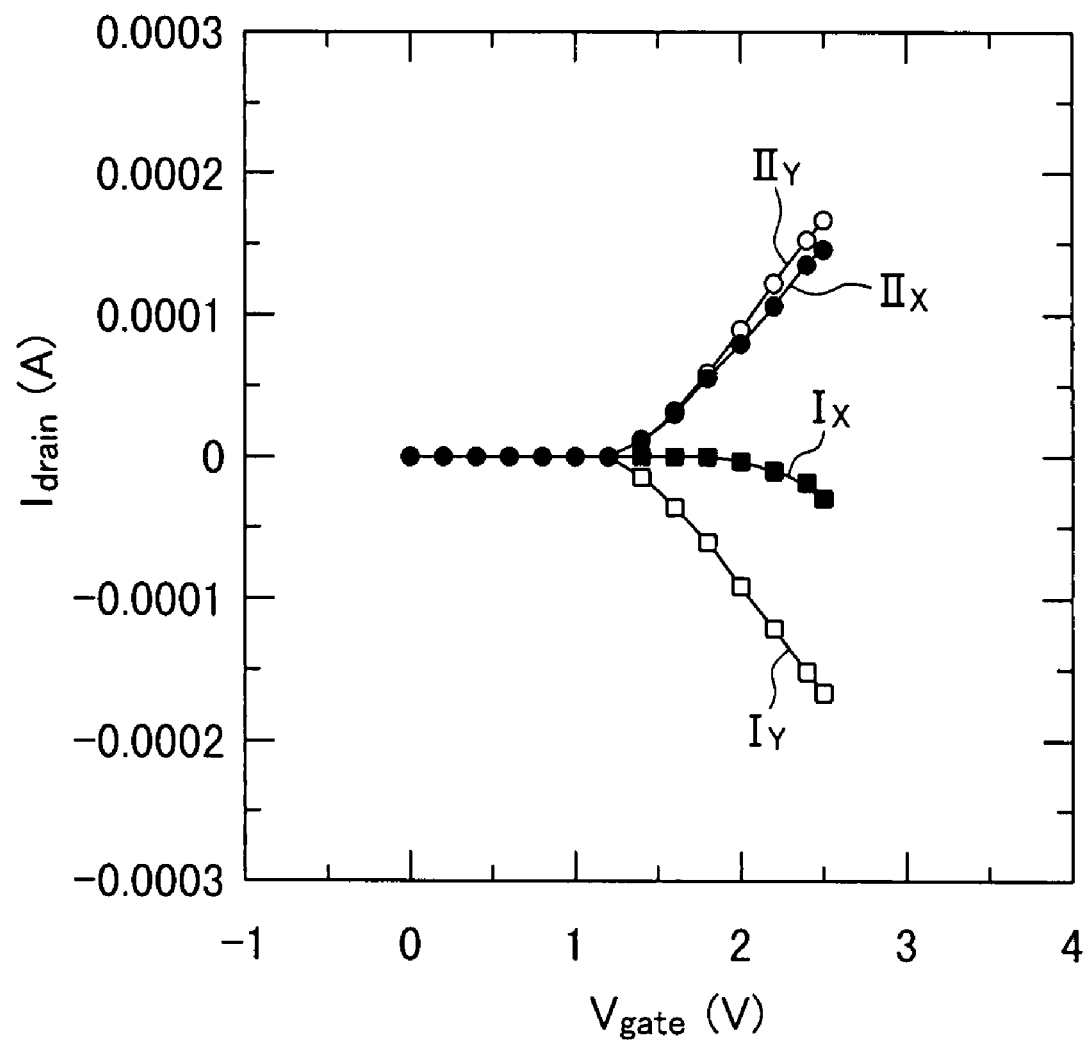
FIG. 8 is a graph illustrating drain current vs. gate voltage in the conventional sidewall memory cell in FIG. 5.

The thickness Ta of the silicon-rich first silicon nitride layer 44 and the thickness Tb of the stoichiometric or nitrogen-rich second silicon nitride layer 45 may both be within the range from, for example, about 1 nm to about 5 nm. The reason why Ta should be less than Tb (Ta<Tb) is that the simulation results described with reference to FIGS. 6 to 8 indicate that electrons should be trapped as close as possible to the silicon substrate 20. Because the depth of the charge trapping level 'a' in the first silicon nitride layer 44 and the height of the potential energy barrier φi at the interface between the first and second silicon nitride layers 44, 45 tends to keep most injected electrons in the first silicon nitride layer 44, the thinner this layer is, the closer the trapped electrons will be to the tunnel oxide film 41 and thus to the silicon substrate 20.

If an amorphous silicon layer is used as the first layer 44, its thickness may be less than 1 nm, resulting in confinement of trapped electrons even closer to the tunnel oxide film 41. Moreover, if an electron reaches the stoichiometric or nitrogen-rich silicon nitride layer 45 and is trapped at level 'b' near the interface 44a between the two layers 44, 45, the electron will still be trapped relatively close to the tunnel oxide film.

The general reason for preferring a thin first layer 44 with a deep electron trapping level and a high trap density is that these properties lead to improved charge trapping characteristics and improved read and write characteristics.

Figure 5:
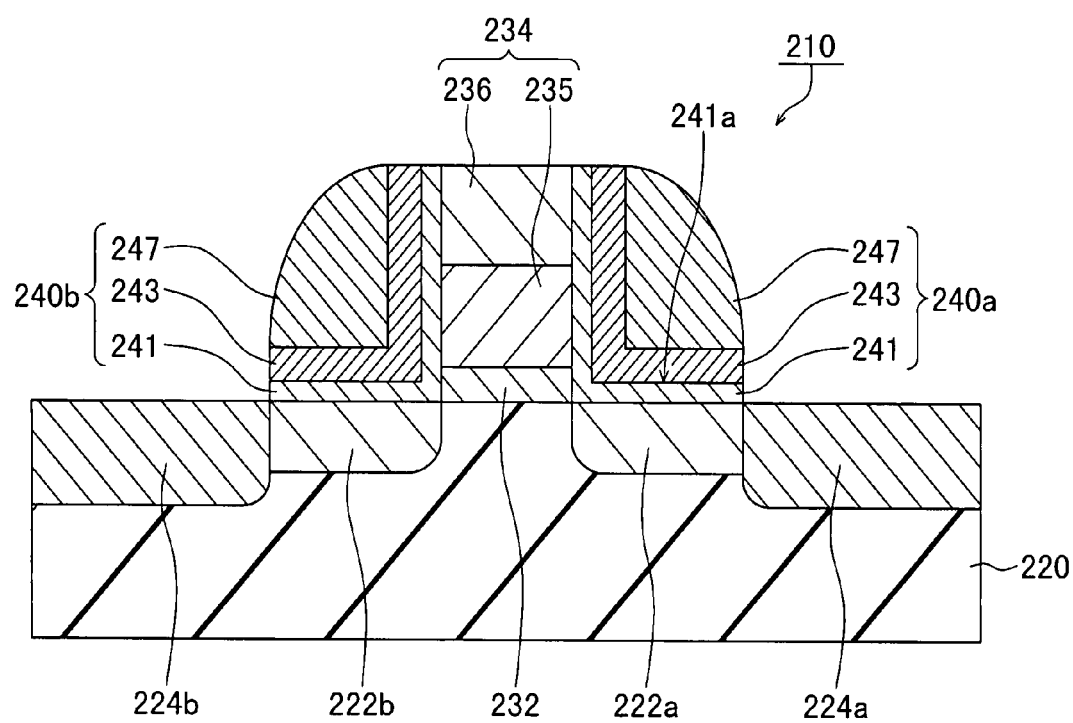
FIG. 5 is a schematic sectional view illustrating a conventional sidewall memory cell.

A method of manufacturing the sidewall memory shown in FIG. 9 will now be described. This sidewall memory has the same structure as the conventional sidewall memory in FIG. 5, except for the structure of the charge trapping film 43. Therefore, the description will concentrate on the manufacturing steps that form the first and second charge traps 40a, 40b, and in particular the charge trapping film 43, which will be assumed to consist of silicon nitride layers.

After the gate electrode 34 has been formed on the surface 20a of the silicon substrate 20, dry oxidation is carried out to grow a silicon oxide film on the first and second variable resistance regions 22a, 22b and the side surfaces 34a of the gate electrode 34. This silicon oxide film, which has a thickness of, for example, about 10 nm, becomes the tunnel oxide film 41.

Next, the silicon-rich first silicon nitride layer 44 is formed on the tunnel oxide film 41 by LP-CVD using dichlorosilane (DCS) and ammonia ($NH_3$) as source gases, in an atmosphere with a temperature of 690° C. to 780° C. and a pressure of about 26.7 Pa (0.2 Torr).

When the $DCS/NH_3$ ratio, that is, the ratio of the DCS flow to the $NH_3$ flow, is set to about 0.1 to 0.2, a substantially stoichiometric silicon nitride film is obtained; that is, an $Si_xN_y$ film with the an x/y ratio equal to substantially 0.75 is obtained. A silicon-rich silicon nitride film is deposited by increasing the DCS flow so that the $DCS/NH_3$ ratio is' equal to about two.

The charge trapping film 43 may also be formed using an atomic layer deposition (ALD) method, that is, the film may be deposited a single atomic layer or a single molecular layer at a time.

In the ALD method, first, an oven is evacuated and sealed, after which an adequate amount of a source gas containing a large quantity of silicon, such as silane ($SiH_4$) or DCS, is supplied. Enough $NH_3$ gas is then added to the supply to generate a plasma, whereby approximately one atomic layer of silicon nitride is deposited. This procedure is then repeated cyclically to build up the desired silicon nitride film.

In this ALD method, the use of trisilane ($Si_3H_8$), which contains a larger quantity of silicon, as the source gas makes it possible to form a silicon-rich silicon nitride film.

To deposit a nitrogen-rich silicon nitride film, in particular, a film with an x/y ratio less than 0.7, a mixture of DCS and $NH_3$ may be used as the source gas in the ALD method. A nitrogen-rich silicon nitride film is thereby formed because of the strong nitriding ability of ammonia plasma.

SECOND EMBODIMENT

Figure 11:
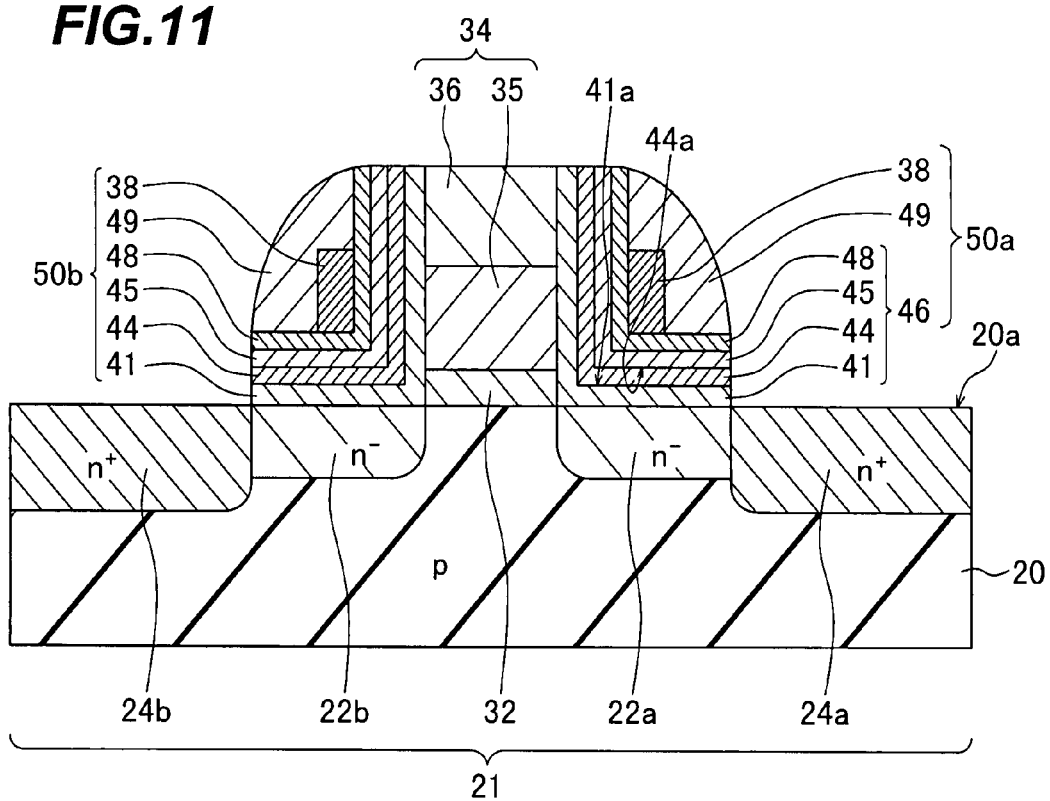
FIG. 11 is a schematic sectional view illustrating a semiconductor memory cell according to a second embodiment of the invention.

Referring to FIG. 11, the second embodiment is a sidewall memory having floating electrodes 38 embedded in the charge traps 50a, 50b. Except for the charge traps 50a, 50b, the memory cell structure is the same as in the first embodiment. Repeated descriptions of the parts other than the charge traps 50a, 50b will be omitted.

The first and second charge traps 50a, 50b have ONO dielectric stacks 46 each including a tunnel oxide film 41, a first silicon nitride layer 44 formed on the tunnel oxide film 41, a second silicon nitride layer 45 formed on the tunnel oxide film 41, and a top oxide film 48 formed on the charge trapping film 43. The first and second silicon nitride layers 44, 45 form a charge trapping film as in the first embodiment. In addition, floating electrodes 38 are formed on the ONO dielectric stacks 46, and sidewall oxide films 49 are also formed on the ONO dielectric stacks 46, covering the floating electrodes 38.

The floating electrodes 38 may comprise, for example, polysilicon doped with phosphorous at a dose of $3 \times 10^{20}$ carriers/$cm^2$. The sidewall oxide films 49 are formed in the same way as the top oxide films 47 in the first embodiment.

Figure 12:
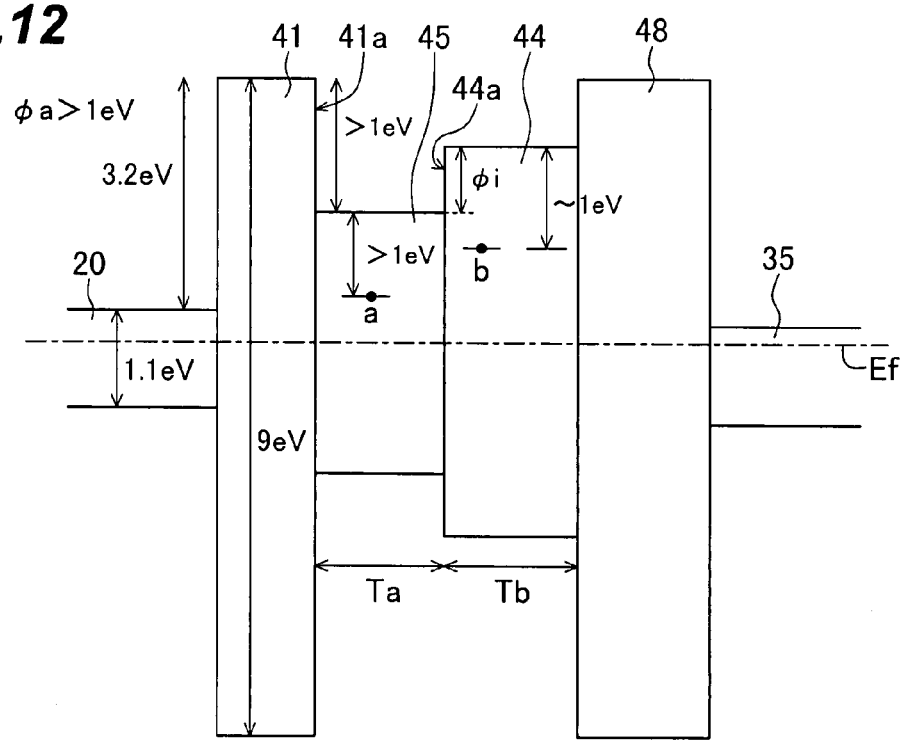
FIG. 12 is an energy level diagram of the memory cell in FIG. 11.

The resulting band gaps and charge trapping levels 'a' and 'b', shown in FIG. 12, are essentially the same as in the first embodiment (FIG. 10).

With this structure, during programming, the floating electrode 38 strengthens the electric field applied across the ONO dielectric stack, in effect by reorienting part of the electric field from the gate electrode 34 so that more of the electric field lines cross the region between the floating electrode and the variable resistance region in the substrate. The strengthened electric field enables more electrons from the substrate to reach the first silicon nitride layer 44. Accordingly, in addition to the advantages of the first embodiment, a further advantage of more effective electron injection is obtained.

Although the additional electric field created by the floating electrode 38 attracts electrons injected into the first silicon nitride layer 44, the potential energy barrier $\phi i$ (FIG. 12) between the first and second silicon nitride layers 44, 45 keeps most injected electrons in the first silicon nitride layer 44, adjacent to the tunnel oxide film 41 as desired. Relatively few electrons reach the second silicon nitride layer 45, and the further potential energy barrier between the second silicon nitride layer 45 and the top oxide layer 48 assures that substantially no electrons are injected into the floating electrode 38.

Although sidewall memories were shown in the preceding embodiments showed, the charge traps and other structures described in the embodiments may be applicable in devices other than sidewall memories.

Those skilled in the art will recognize that further variations are possible within the scope of the invention, which is defined in the appended claims.

What is claimed is:

1. A semiconductor memory device comprising:
   a control electrode disposed on a gate insulating film disposed on a major surface of a semiconductor substrate;
   a pair of diffusion regions formed in said major surface of the semiconductor substrate on mutually opposite sides of the control electrode; a pair of variable resistance regions formed in said major surface of the semiconductor substrate on mutually opposite sides of the control electrode, disposed between the pair of diffusion regions and the control electrode, and having a lower impurity concentration than the pair of diffusion regions; and
   a pair of charge traps disposed above the pair of variable resistance regions, each charge trap including a tunnel oxide film, a charge trapping film disposed on the tunnel oxide film, and a top oxide film disposed on the charge trapping film; wherein the charge trapping film has a dual-layer structure including a first layer formed on and over the tunnel oxide film and a second layer formed on and over the first layer, the first layer having a first band gap with a first upper boundary, the second layer having a second band gap with a second upper boundary, the first band gap including a first charge trapping level, the first upper boundary being lower than the second upper boundary.

2. The semiconductor memory device of claim 1, wherein the tunnel oxide film has a third band gap with a third upper boundary more than one electron volt higher than the first upper boundary.

3. The semiconductor memory device of claim 1, wherein the first charge trapping level is more than one electron volt below the first upper boundary.

4. The semiconductor memory device of claim 1, wherein the second band gap includes a second charge trapping level.

5. The semiconductor memory device of claim 4, wherein the second charge trapping level is substantially one electron volt below the second upper boundary.

6. The semiconductor memory device of claim 1, wherein the first layer is a silicon-rich silicon nitride layer and the second layer is a stoichiometric or nitrogen-rich silicon nitride layer.

7. The semiconductor memory device of claim 6, wherein the ratio (x/y) of the number (x) of silicon atoms in the first layer to the number (y) of nitrogen atoms in the first layer is at least 0.8.

8. The semiconductor memory device of claim 6, wherein the ratio (x/y) of the number (x) of silicon atoms in the second layer to the number (y) of nitrogen atoms in the second layer is at most 0.7.

9. The semiconductor memory device of claim 6, wherein the first layer has a thickness of at least one nanometer and not more than five nanometers.

10. The semiconductor memory device of claim 6, wherein the second layer has a thickness equal to or greater than the thickness of the first layer and equal to or less than five nanometers.

11. The semiconductor memory device of claim 1, wherein the first layer is an amorphous silicon layer and the second layer is a stoichiometric or nitrogen-rich silicon nitride layer.

12. The semiconductor memory device of claim 11, wherein the first layer is at most one nanometer thick.

13. The semiconductor memory device of claim 1, wherein each charge trap also includes:
a floating electrode disposed on the top oxide film; and
a sidewall oxide film covering the floating electrode.

* * * * *